US010925184B2

(12) United States Patent
Morita et al.

(10) Patent No.: US 10,925,184 B2
(45) Date of Patent: Feb. 16, 2021

(54) DATA CENTER

(71) Applicants: NTT Ltd Japan Corporation, Chiyoda-ku (JP); RagingWire Data Centers, Inc., Sacramento, CA (US)

(72) Inventors: Tomoki Morita, Kawasaki (JP); Kuang Min Tan, Sumida-ku (JP); Naoki Yoshida, Katsushika-ku (JP); Taku Oyama, Ota-ku (JP); Robert Patrick Wichert, Sacramento, CA (US)

(73) Assignees: NTT Ltd Japan Corporation, Chiyoda-ku (JP); RagingWire Data Centers, Inc., Sacramento, CA (US)

( * ) Notice: Subject to any disclaimer, the term of this patent is extended or adjusted under 35 U.S.C. 154(b) by 0 days.

(21) Appl. No.: 16/180,545

(22) Filed: Nov. 5, 2018

(65) Prior Publication Data

US 2020/0146187 A1  May 7, 2020

(51) Int. Cl.
*H05K 7/20* (2006.01)
*H05K 7/14* (2006.01)

(52) U.S. Cl.
CPC ....... *H05K 7/20745* (2013.01); *H05K 7/1497* (2013.01)

(58) Field of Classification Search
CPC .. H05K 7/20572; H05K 7/206; H05K 7/2069; H05K 7/20618; H05K 7/20736;
(Continued)

(56) References Cited

U.S. PATENT DOCUMENTS 7,534,167 B2 * 5/2009 Day ................... H05K 7/20745
454/187
8,582,292 B1 * 11/2013 Eichelberg ......... H05K 7/20736
361/679.49
(Continued)

FOREIGN PATENT DOCUMENTS

JP  2015-161429 A  9/2015
JP  2016-183853 A  10/2016
JP  2016-533561 A  10/2016

OTHER PUBLICATIONS

International Search Report dated Mar. 26, 2019, in PCT/JP2019/007060, 4 pages (with English Translation of Category of Cited Documents).
(Continued)

*Primary Examiner* — Zachary Pape
*Assistant Examiner* — Amir A Jalali
(74) *Attorney, Agent, or Firm* — Oblon, McClelland, Maier & Neustadt, L.L.P.

(57) ABSTRACT

A data center includes a floor; a side wall configured to partition a space above the floor into a room; a plurality of heat generating device columns arranged in a row direction on the floor, each of the plurality of heat generating device columns including a plurality of heat generating devices that are arranged to form a column in a column direction; an air blower including a plurality of air outlets disposed along a side with respect to the row direction, facing the plurality of heat generating device columns, the air blower being configured to blow air in the column direction from, the plurality of air outlets; and an inclined ceiling that increases in height from a first side toward a second side in the row direction.

13 Claims, 4 Drawing Sheets

(58) Field of Classification Search
CPC .......... H05K 7/20754; H05K 7/20745; H05K 7/1497; F24F 13/068; F24F 13/08; F24F 2221/40
USPC .......... 361/695–696, 679.49–679.51, 679.48
See application file for complete search history.

(56) References Cited

U.S. PATENT DOCUMENTS

| | | | | |
|---|---|---|---|---|
| 8,833,001 | B2* | 9/2014 | Gardner | E04B 1/34384 |
| | | | | 52/64 |
| 8,844,220 | B2* | 9/2014 | Boersema | F24F 11/0001 |
| | | | | 52/220.1 |
| 9,420,730 | B2* | 8/2016 | Hwang | H05K 7/20836 |
| 9,439,329 | B1* | 9/2016 | Towner | H05K 7/20745 |
| 9,661,778 | B1* | 5/2017 | Ross | H05K 7/1497 |
| 9,668,375 | B2* | 5/2017 | Totani | H05K 7/20136 |
| 9,949,410 | B1* | 4/2018 | Kowalski | H05K 7/20745 |
| 10,072,859 | B2* | 9/2018 | Phillips | G06F 1/16 |
| 10,356,954 | B2* | 7/2019 | Bao | H05K 7/20736 |
| 2011/0009047 | A1 | 1/2011 | Noteboom et al. | |
| 2013/0031928 | A1 | 2/2013 | Kim | |
| 2013/0081784 | A1* | 4/2013 | Faig Palomer | H05K 7/20745 |
| | | | | 165/80.2 |
| 2013/0201618 | A1* | 8/2013 | Czamara | H05K 7/1497 |
| | | | | 361/679.5 |
| 2015/0098177 | A1 | 4/2015 | Wilcox et al. | |
| 2015/0382512 | A1* | 12/2015 | Rogers | H05K 7/20745 |
| | | | | 361/679.49 |
| 2017/0027086 | A1* | 1/2017 | Noteboom | F24F 11/0001 |

OTHER PUBLICATIONS

Office Action dated Jun. 28, 2020 in Japanese Application No. 2019-528929 (English translated).

* cited by examiner

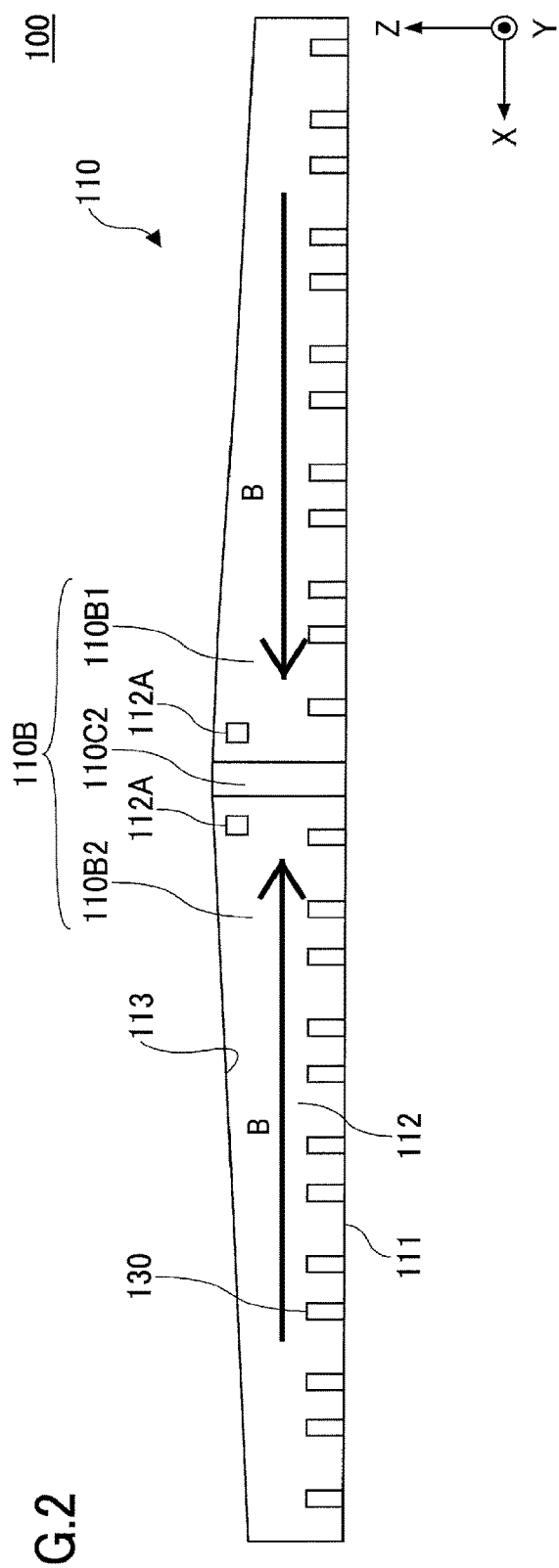
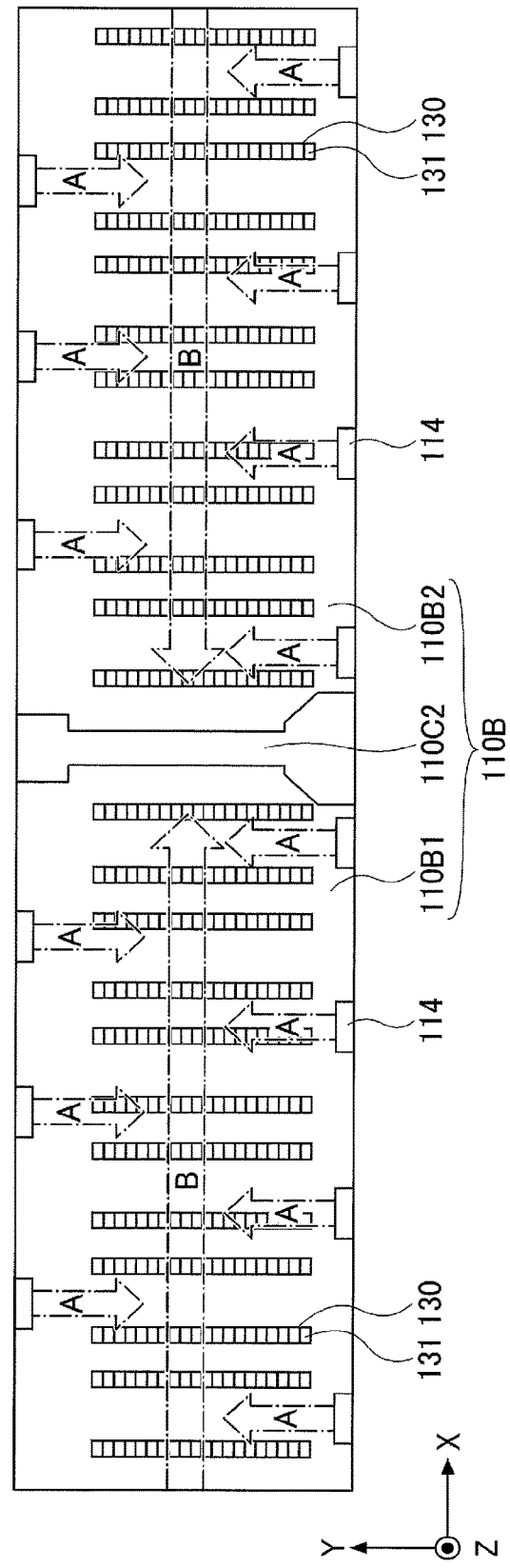

DATA CENTER

BACKGROUND OF THE INVENTION

1. Field of the Invention

The present invention relates to a data center.

2. Description of the Related Art

Conventionally, there is a data center in which a double floor including a bottom floor and an access floor, which is provided above the bottom floor and which includes a through hole, is provided in the room of the data center. An air direction adjusting plate is provided in the room for passing an airflow, which is from an air conditioner disposed at the side of the room, between the bottom floor and the access floor, and for blocking the airflow between the bottom floor and the access floor to change the wind direction upward. Accordingly, it is possible to supply air to a rack type server disposed on the access floor (for example, see Patent Document 1).

Patent Document 1: U.S. Patent Application Publication No. 2013/0031928

However, for the conventional data center, no particular method has been devised with respect to how to guide the air, which is supplied to a heat generating device such as a rack type server, in the room of the data center. The air, which has cooled the heat generating device, has risen in temperature, and accumulates in a space in the room that is higher than the access floor. Therefore, in the conventional data center, it is not possible to efficiently cool the heat generating device.

SUMMARY OF THE INVENTION

An aspect of the present invention provides a data center in which one or more of the disadvantages of the related art are reduced.

According to one aspect of the present invention, there is provided a data center including a floor; a side wall configured to partition a space above the floor into a room; a plurality of heat generating device columns arranged in a row direction on the floor, each of the plurality of heat generating device columns including a plurality of heat generating devices that are arranged to form a column in a column direction; an air blower including a plurality of air outlets disposed along a side with respect to the row direction, facing the plurality of heat generating device columns, the air blower being configured to blow air in the column direction from the plurality of air outlets; and an inclined ceiling that increases in height from a first side toward a second side in the row direction.

BRIEF DESCRIPTION OF THE DRAWINGS

FIG. 2 is a cross-sectional view taken along a line A-A in FIG. 1;

FIG. 3 is a plan view of a power supply zone;

DETAILED DESCRIPTION OF THE PREFERRED EMBODIMENTS

Embodiments to which the data center according to the present invention is applied, will be described below.

Embodiment

Figure 1:
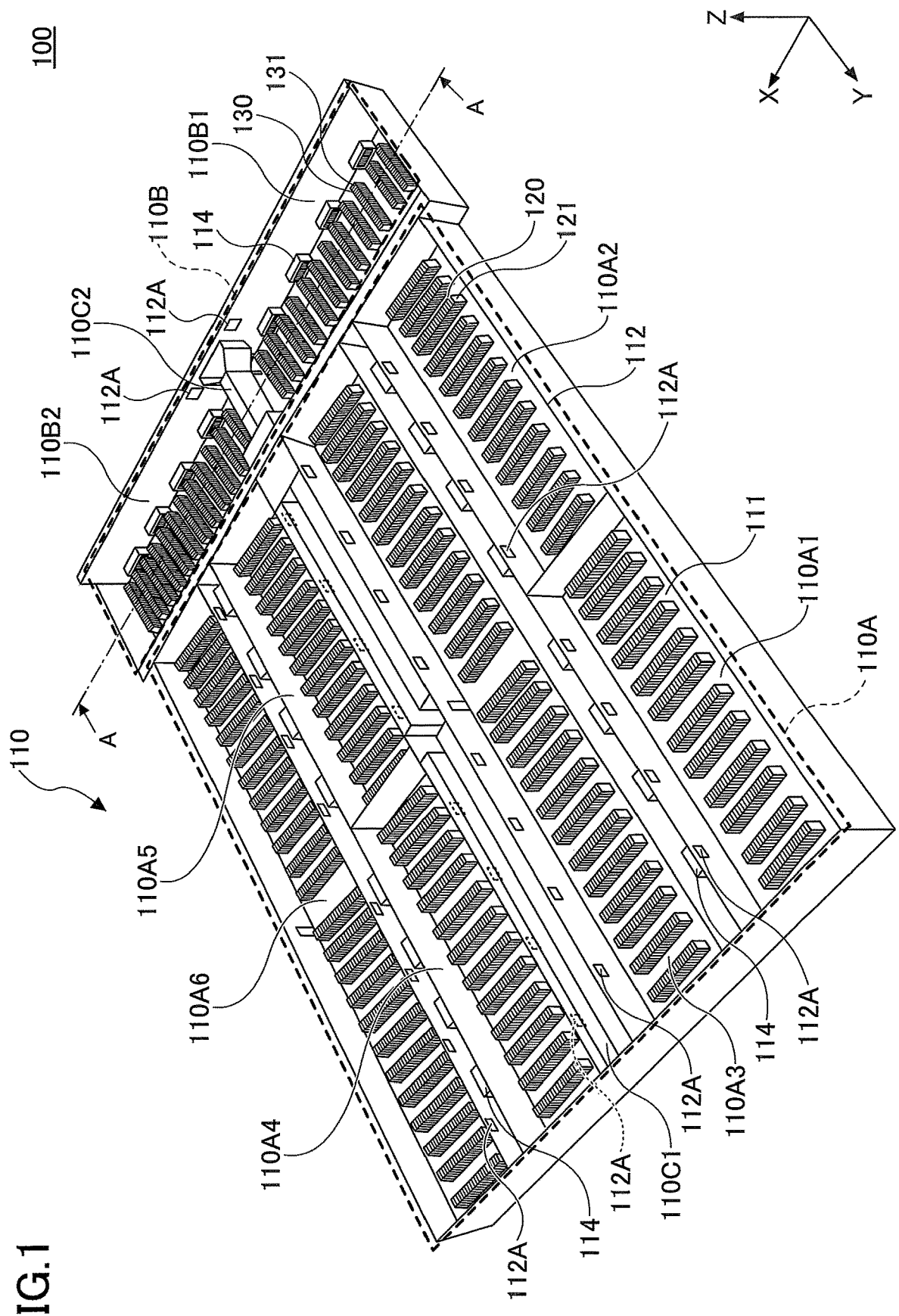
FIG. 1 is a diagram illustrating a data center.

FIG. 1 is a diagram illustrating a data center 100. FIG. 2 is a cross-sectional view taken along a line A-A in FIG. 1. The following description will be made by using a XYZ coordinate system. The Z axis positive direction is a vertically upward direction.

The data center 100 includes a building 110, a plurality of server columns 120, and a plurality of UPS (Uninterruptible Power Supply) columns 130.

The building 110 includes a floor 111, side walls 112, an inclined ceiling 113, and cooling devices 114. In FIG. 1, the inclined ceiling 113 is omitted. The building 110 includes rooms 110A1, 110A2, 110A3, 110A4, 110A5, 110A6, 110B1, and 110B2, and corridors 110C1 and 110C2, surrounded by the floor 111, the side walls 112, and the Inclined ceiling 113.

The rooms 110A1 to 110A6 and the corridor 110C1 are included in a server zone 110A. The server zone 110A includes the six rooms 110A1 to 110A6 for disposing rack type servers, and the corridor 110C1 leading to the rooms 110A1 to 110A6.

The rooms 110A1 and 110A2, and the rooms 110A4 and 110A5, are respectively partitioned by the side wall 112 at the center in the Y axis direction of the server zone 110A. The rooms 110A3 and 110A6 extend from the end portion in the Y axis negative direction to the end portion in the Y axis positive direction of the server zone 110A. Therefore, the sizes of the rooms 110A1, 110A2, 110A4, and 110A5 are half the size of the rooms 110A3 and 110A6.

Note that the power that can be supplied to each of the rooms 110A1, 110A2, 110A4, and 110A5 is 2 MW. Furthermore, the power that can be supplied to each of the rooms 110A3 and 110A6 is 4 MW. All of the server columns 120 are supplied with power that is taken in from the outside of the data center 100 and that Is supplied via the UPS columns 130.

In this way, by equalizing the power consumption of the server columns 120 disposed on both sides of the corridor 110C1, it is intended to equalize the power generation amount on both sides of the corridor 110C1.

Furthermore, the rooms 110B1 and 110B2 and the corridor 110C2 are included in a power supply zone 110B. The power supply zone HOB includes the rooms 110B1 and 110B2 in which a plurality of the UPS columns 130 are disposed, and the corridor 110C2 disposed between the rooms 110B1 and 110B2.

The corridors 110C1 and 110C2 extend along the Y axis, and windows are provided in the corridors 110C1 and 110C2 so that the inside of the rooms 110A3, 110A4, 110A5, 110B1, and 110B2 can be seen. Therefore, it is possible to see inside the rooms 110A3, 110A4, 110A5, 110B1, and 110B2 illuminated by LED (Light Emitting Diode) lighting from the corridors 110C1 and 110C2, as if seen in a showcase. The corridors 110C1 and 110C2 have a shape that is line symmetric with respect to a central axis that is parallel to the Y axis that passes through the center of the width in the X axis direction in a planar view.

The floor 111 is provided in the entire building 110 in a planar view. The floor 111 has a double floor structure in the server zone 110A, and a mesh-like mesh floor is provided on the bottom floor. The floor 111 in the power supply zone 110B does not have a double floor structure.

The side walls 112 partition the space above the floor 111 into the rooms 110A1 to 110A6, 110B1 and 110B2, and the corridors 110C1 and 110C2. Furthermore, two side walls 112 are provided between the server zone 110A and the power supply zone HOB, and there is a space between the two side walls 112. The side wall 112 extends from the floor 111 to the inclined ceiling 113 in the Z axis direction.

The side wall 112 includes exhaust ports 112A. The hot air that is collected from the exhaust ports 112A is circulated within the data center 100, cooled at the cooling devices 114, and then supplied again as cold air under the floor of the server zone 110A. Furthermore, the hot air that is collected from the exhaust ports 112A may be discharged outside through an outdoor machine installed on the roof.

In the rooms 110A1, 110A2, and 110A3, the exhaust ports 112A are provided directly below the inclined ceiling 113 in the side walls 112 extending in the Y axis direction, on the side (on the X axis positive direction side) where the inclined ceiling 113 is highest. In the rooms 110A4, 110A5, and 110A6 the exhaust ports 112A are provided directly below the inclined ceiling 113 in the side walls 112 extending in the Y axis direction, on the side (on the X axis negative direction side) where the inclined ceiling 113 is highest.

Furthermore, in the room 110B1, the exhaust port 112A is provided in the side wall 112 on the Y axis negative direction side, directly below the inclined ceiling 113 at the end portion on the X axis positive direction side where the inclined ceiling 113 is highest. Note that in the case where there is an exhaust mechanism, which is connected to the outside air, in the side wall 112 at the boundary between the room 110B1 and the rooms 110A2 and 110A3, in the room 110B1, the exhaust port 112A may also be provided in the side wall 112 on the Y axis positive direction side, directly below the inclined ceiling 113, at the end portion on the X axis positive direction side where the inclined ceiling 113 is highest.

In the rooms 110B1 and 110B2, the configuration of the side wall 112 and the exhaust port 112A is bilaterally symmetric with respect to the corridor 110C2 when viewed from the Y axis direction. Therefore, in the room 110B2, the exhaust port 112A is provided in the side wall 112 on the Y axis negative direction side, directly below the inclined ceiling 113 at the end portion on the X axis negative direction side where the inclined ceiling 113 is highest. The hot air, which has taken away the heat from the UPS columns 130, is guided to the higher side along the inclination of the inclined ceiling 113, and therefore the hot air is collected from the exhaust port 112A provided in the side wall 112, at the highest portion of the inclined ceiling 113.

Note that in the case where there is an exhaust mechanism, which is connected to the outside air, in the side wall 112 at the boundary between the room 110B1 and the rooms 110A2 and 110A3, in the room 110B2, the exhaust port 112A may also be provided in the side wall 112 on the Y axis positive direction side, directly below the inclined ceiling 113 at the end portion in the X axis negative direction side where the inclined ceiling 113 is highest.

The inclined ceiling 113 is connected to the upper end of the side wall 112. The inclined ceiling 113 is provided below the roof of the building 110. Here, the roof is omitted. The height of the inclined ceiling 113 is highest at the corridors 110C1 and 110C2, and becomes lower toward the X axis positive direction and the X axis negative direction than at the corridors 110C1 and 110C2. The height of the inclined ceiling 113 is lowest at the end in the X axis positive direction and at the end in the X axis negative direction of the building 110. Therefore, when the building 110 is viewed from the side in the Y axis direction, the inclined ceiling 113 rises toward the center.

The cooling device 114 has a function of an air conditioner for cooling the outside air, and blows the cooled air. The cooling device 114 is disposed on the floor 111.

The cooling devices 114 for cooling the rooms 110A1 to 110A6 are disposed between the two side walls 112 that are between the rooms 110A1 and 110A2 and the room 110A3, and disposed between the two side walls 112 that are between the rooms 110A4 and 110A5 and the room 110A6. The cooling device 114 is configured to blow air from both sides in the X axis direction, into the portion between the bottom floor and the mesh floor of the double structure floor 111, in the X axis direction. In FIG. 1, the mesh floor is illustrated as the server zone 110A, and therefore the air outlets are not visible.

Furthermore, the cooling devices 114 for cooling the rooms 110B1 and 110B2 are disposed along the side walls 112 on the Y axis positive direction side and the Y axis negative direction side inside the rooms 110B1 and 110B2. The cooling device 114 on the Y axis positive direction side has the air outlet 114A for blowing air on the Y axis negative direction side, and the cooling device 114 on the Y axis negative direction side has the air outlet 114A for blowing air on the Y axis positive direction side. The cooling devices 114 in the rooms 110B1 and 110B2 blow air in the Y axis direction.

The plurality of server columns 120 are arranged inside the rooms 110A1 to 110A6. Each server column 120 has an island shape that is long in the X axis direction and short in the Y axis direction in a planar view. The reason why the server column 120 has an island shape in the planar view is that a plurality of rack servers 121 are disposed side by side in the X axis direction. The rack server 121 is an example of a rack type information processing apparatus.

The intervals in the Y axis direction between the server columns 120 inside the rooms 110A1 to 110A6 are equal, and the center of the length in the X axis direction of each server column 120 matches the center of the length in the X axis direction of each of the rooms 110A1 to 110A6. This is to equalize the heat radiation and the cooling of the server columns 120.

The number of the rack servers 121 included in each server column 120 is, for example, 10 to 20. When the number of the rack servers 121 included in the server column 120 is 10, ten rack servers 221 are disposed adjacent, to each other in the X axis direction. Furthermore for example in each rack server, 10 to 20 servers are held in a rack and are disposed in an overlapping manner in the Z axis direction.

Note that as an example, the number of the server columns 120 arranged in the Y axis direction in the rooms 110A1, 110A2, 110A4, and 110A5, is 20 to 30, and the number of server columns 120 arranged in the Y axis direction in the rooms 110A3 and 110A6 is 40 to 60. Furthermore, as one example, the number of the server columns 120 arranged in the X axis direction in the rooms 110A1 to 110A6 is one; however the number of the server columns 120 may be plural.

The plurality of UPS columns 130 are arranged inside the rooms 110B1 and 110B2. Each of the UPS columns 130 has an island shape that is long in the Y axis direction and short in the X axis direction in a planar view. The reason why the UPS column 130 has an island shape in planar view is that a plurality of UPSs 131 are disposed side by side in the Y axis direction. The UPS 131 is an example of a heat generating device, and the UPS column 130 is an example of a heat generating device column.

The intervals in the X axis direction between the UPS columns 130 inside the rooms 110B1 and 110B2 are equal, and the center of the length in the Y axis direction of each UPS column 130 matches the center of the length in the Y axis direction of each of the rooms 110B1 and 110B2. This is to equalize the heat radiation and the cooling of the UPS columns 130.

The number of UPSs 131 included in each UPS column 130 is, for example, 10 to 20. When the number of UPSs 131 included in the UPS column 130 is 10, ten UPSs 131 are disposed adjacent to each other in the Y axis direction.

Note that as one example, the number of UPS columns 130 arranged in the X axis direction in the rooms 110B1 and 110B2 is 20 to 30. Furthermore, as one example, the number of UPS columns 130 arranged in the Y axis direction in the rooms 110B1 and 110B2 is one; however, the number of the UPS columns 130 may be plural.

Hereinafter, in the power supply zone HOB, the direction (Y axis direction) in which a plurality of the UPSs 131 are arranged in the UPS column 130 is referred to as a column direction, and the direction (X axis direction) in which a plurality of the UPS columns 130 are arranged is referred to as row direction.

Next, the configuration of the power supply zone HOB will be described with reference to FIG. 3 in addition to FIG. 1 and FIG. 2. FIG. 3 is a plan view of the power supply zone 110B.

The rooms 110B1 and 110B2 are bilaterally symmetric with respect to the corridor 110C2 when viewed from the Y axis direction. In other words, as viewed from the Y axis direction, the rooms 110B1 and 110B2 are line symmetric, with a straight line passing in the Z axis direction through the center of the corridor 110C2 in the X axis direction, as the axis of symmetry. The room 110B1 is an example of a first room and the room 110B2 is an example of a second room.

The side wall 112, the exhaust port 112A, the inclined ceiling 113, the cooling device 114, the air outlet 114A, and the plurality of UPS columns 130 are bilaterally symmetric with respect to the corridor 110C2 when viewed from the Y axis direction. The meaning of bilateral symmetry is the same as that for the rooms 110B1 and 110B2.

Furthermore, the side wall 112, the exhaust port 112A, the inclined ceiling 113, the cooling device 114, the air outlet 114A, and the plurality of UPS columns 130 are bilaterally symmetric with respect to the corridor 110C2 in a planar view. In other words, in a planar view, the side wall 112, the exhaust port 112A, the inclined ceiling 113, the cooling device 114, the air outlet 114A, and the plurality of UPS columns 130 are disposed in n line-symmetric manner, with a straight line passing in the Y axis direction through the center of the corridor 110C2 in the X axis direction, as the axis of symmetry.

As described above, the rooms 110B1 and 110B2, the side wall 112, the exhaust port 112A, the inclined ceiling 113, the cooling device 114, and the plurality of UPS columns 130 are disposed symmetrically with respect to the corridor 110C2, in order to equalize the cooling characteristics of the UPS columns 130 inside the rooms 110B1 and 110B2.

The data center 100 has a bilaterally symmetric configuration as described above, and therefore in the following, the configuration relating to the room 110B1 will be described.

The inclined ceiling 113 is inclined so as to become higher from the X axis negative direction side toward the X axis positive direction side in the room 110B1. In the room 110B1, the X axis negative direction side is an example of a first side and the X axis positive direction side is an example of a second side.

Figure 4:
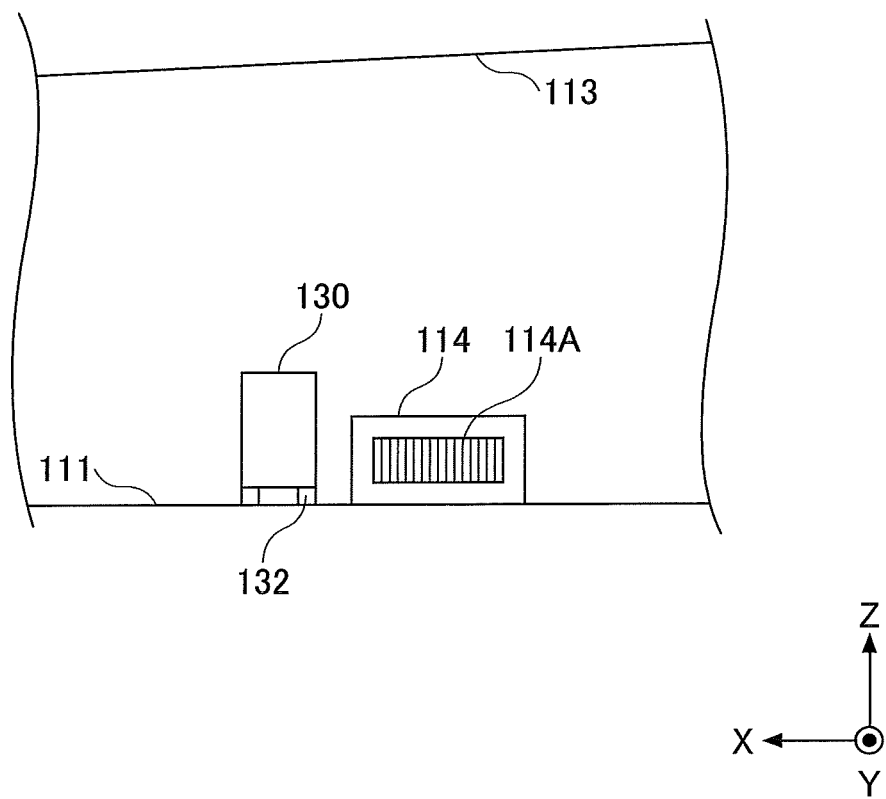
FIG. 4 is a diagram illustrating an installation structure of UPS columns.

As illustrated in FIG. 4, the UPS column 130 is disposed on the floor 111 via a slab 132. Air is blown to the UPS column 130 from the air outlets 114A of the cooling devices 114 positioned on both sides in the Y axis direction. The air blown to the UPS column 130 passes through gaps, etc., of the UPS column 130, takes away the heat of the UPS column 130, and becomes hot air and comes out from the upper side (Z axis positive direction side) of the UPS column 130.

The plurality of the UPS columns 130 are arranged in the X axis direction, and each of the UPS columns 130 includes a plurality of the UPSs 131 arranged in a column. The plurality of the UPS columns 130 all have equal heights, as an example.

Therefore, the clearance between each of the plurality of the UPS columns 130 and the inclined ceiling 113 increases from the X axis negative direction side toward the X axis positive direction side. The air that takes away the heat from the UPS column 130 and that is blown upward from the bottom of the UPS column 130, is guided from the lower side to the higher side of the inclined ceiling 113. Therefore, hot air is guided to the higher side of the inclined ceiling 113. That is, hot air is collected at the higher side of the Inclined ceiling 113.

Therefore, the clearance between the UPS column 130 and the inclined ceiling 113 is increased at the higher side of the inclined ceiling 113, to provide a space capable of collecting hot air.

Furthermore, the number of UPSs 131 included in each of the plurality of the UPS columns 130 may be smaller on the X axis positive direction side than on the X axis negative direction side. The air, which has been heated as a result of taking away the heat from the UPS columns 130, is collected at the X axis positive direction side where the inclined ceiling 113 is high, in the X axis direction. Therefore, if the number of UPSs 131 is decreased on the X axis positive direction side, the cooling efficiency of the plurality of the UPS columns 130 in the X axis direction can be more uniform.

Furthermore, the intervals between two adjacent UPS columns 130 in the X axis direction are all equal. This is for equalizing the cooling efficiency of the plurality of the UPS columns 130 in the X axis direction.

The cooling device 114 is an example of an air blower, and the cooling device 114 includes a plurality of air outlets 114A disposed along the sides (Y axis positive direction side and Y axis negative direction side) with respect to the X axis direction, facing the plurality of UPS columns 130, and blows air in a column direction from a plurality of the air outlets 114A.

The cooling device 114 is provided at the bottom of the side wall 112, on the Y axis positive direction side and the Y axis negative direction side, so that the back side, opposite to the front side where the air cutlet 114A is positioned, is in contact with the side wall 112. Therefore, the cooling devices 114 are positioned inside the room 110B1.

The cooling device 114 blows cooling air at a predetermined temperature that is lower than room temperature. As illustrated in FIG. 4, the cooling device 114 includes the air outlet 114A provided at a position higher than the floor 111. The position of the lower end of the air outlet 114A in the height direction, is higher than the upper end of the slab 132. Therefore, as illustrated in FIG. 4, a height difference is provided between the air outlet 114A and the floor 111. The height difference is an interval in the height direction and is about 1 inch to several inches.

In this way, by disposing the air outlets 114A at positions higher than the floor 111, the air blown from the air outlets 114A blows down to the floor 111, and air can be supplied even further. Furthermore, when water or dust accumulates on the floor ill, entry of water or dust into the cooling device 114 can be suppressed.

The cooling devices 114 are provided on the side walls 112 on the Y axis positive direction side and the Y axis negative direction side, and therefore the air outlets 114A are disposed on both sides (Y axis positive direction side and Y axis negative direction side) with respect to the X axis direction for the UPS columns 130, and air is blown from both sides with respect to the X axis direction. Therefore, air is efficiently introduced between the adjacent UPS columns 130, and all of the UPS columns 130 can be efficiently cooled.

Furthermore, as illustrated in FIG. 3, the plurality of the cooling devices 114 are alternately disposed in the X axis direction, on one side and the other side with respect to the X axis direction. Therefore, the plurality ox air outlets 114A are alternately disposed in the X axis direction, on one side and the other side with respect to the X axis direction. Therefore, air is efficiently introduced from the alternate directions into the space between the adjacent UPS columns 130, and all of the UPS columns 130 can be efficiently cooled.

The height from the floor 111 to the upper end of the air outlet 114A is set to be less than half the height between the floor 111 and the inclined ceiling 113. Therefore, air can be blown mainly to the lower side of the UPS columns 130, and all the UPS columns 130 can be efficiently cooled.

Furthermore, the exhaust port 112A is provided in the side wall 112 on the Y axis negative direction side, directly below the inclined ceiling 113 at the end portion on the X axis positive direction side where the inclined ceiling 113 is highest. Directly below the inclined ceiling 113 means a position as high as possible at a position lower than the inclined ceiling 113.

By providing the exhaust port 112A at a position that is as high as possible, hot air guided to the highest position of the inclined ceiling 113 can be collected from the exhaust port 112A.

When installing the exhaust ports 112A, restrictions may arise due to the internal structure of the side wall 112 and the internal structure of the inclined ceiling 113. Therefore, the height of the exhaust port 112A is preferably greater than or equal to the height of the inclined ceiling 113 on the X axis negative direction side. This is because if the exhaust port 112A is positioned higher than the lowest part of the inclined ceiling 113, the hot air can be efficiently collected from the exhaust port 112A.

Furthermore, in this case, it will suffice if the upper end of the exhaust port 112A is greater than or equal to the height of the inclined ceiling 113 on the X axis negative direction side. This is because if the upper end of the exhaust port 112A is higher than the lowest part of the inclined ceiling 113, hot air can be efficiently collected from the exhaust port 112A.

As described above, the cooling device 114 blows air in the direction along the columns of the UPS columns 130 (Y axis direction). Furthermore, the inclined ceiling 113 becomes higher from the X axis negative direction side toward the X axis positive direction side.

Thus, air is blown from the cooling device 114 as indicated by an arrow A in the Y axis direction in FIG. 3, to cool the UPS column 130 when the air is blown out from the lower side to the upper side of the UPS column 130, and the heated air is guided to the higher side of the inclined ceiling 113 as indicated by an arrow B.

Therefore, it is possible to provide the data center 100 capable of efficiently cooling the UPS column 130.

Furthermore, the exhaust port 112A is provided on the side wall 112 on the Y axis negative direction side, directly below the inclined ceiling 113 at the end portion in the X axis direction where the inclined ceiling 113 is highest. Therefore, the hot air, which is guided to the highest position of the inclined ceiling 113, can be efficiently collected from the exhaust port 112A.

Note that in the above description, an embodiment in which the heat generating device is the UPS column 130 has been described. However, a plurality of the server columns 120 may be disposed similarly to the UPS columns 130.

Figure 5:
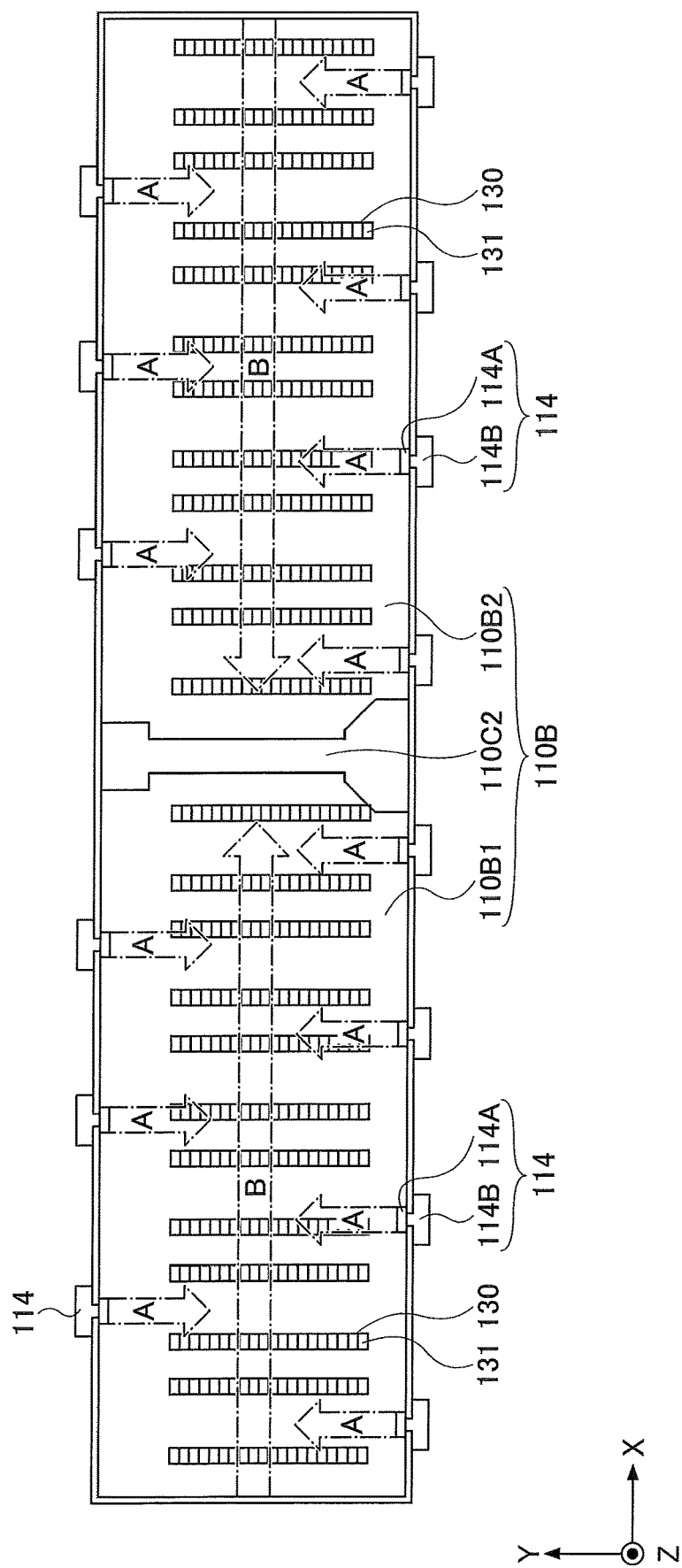
FIG. 5 is a plan view of a modified example of the power supply zone.

Furthermore, in the above description, an embodiment in which the cooling devices 114 are provided inside the rooms 110B1 and 110B2 has been described. However, as illustrated in FIG. 5, in the case where the cooling device 114 includes an air blowing device 114B for sending the cooled air to the plurality of the air outlets 114A, the air blowing device 114B may be disposed outside of the rooms 110B1 and 110B2. The air blowing device 114B has a function of an air conditioner for cooling the outside air, and sends the cooled air to the air outlets 114A inside the rooms 110B1 and 110B2.

Although the data center according to the exemplary embodiment of the present invention has been described above, the present invention is not limited to the specifically disclosed embodiments, and various modifications and changes may be made.

According to one embodiment of the present invention, a data center in which a heat generating device can be efficiently cooled, is provided.

The data center is not limited to the specific embodiments described in the detailed description, and variations and modifications may be made without departing from the spirit and scope of the present invention.

What is claimed is:
1. A data center comprising: a floor;
a first side wall configured to partition a space above the floor into a first room; a plurality of first heat generating device columns arranged in a row direction on the floor, each of the plurality of first heat generating device columns including a plurality of first heat generating devices as a plurality of rack servers disposed adjacent to each other that are arranged in a column, when viewed overhead above the floor, in a column direction which is parallel to a longest side of each of the columns when viewed overhead above the floor and is perpendicular to the row direction when viewed overhead above the floor;
a first air blower including a plurality of first air outlets disposed along a side with respect to the row direction, facing the plurality of first heat generating device columns, the first air blower being configured to blow air in the first room in the column direction from the plurality of first air outlets, wherein a front and back of the plurality of rack servers in each of the first heat generating device columns are exposed within the first room;

a first inclined ceiling that increases in height from a first side toward a second side in the row direction;

a second side wall configured to partition a space above the floor into a second room; a plurality of second heat generating device columns arranged in the row direction on the floor, each of the plurality of second heat generating device columns including a plurality of second heat generating devices as a plurality of rack servers disposed adjacent to each other that are arranged in a column, when viewed overhead above the floor, in the column direction which is parallel to a longest side of each of the columns when viewed overhead above the floor and is perpendicular to the row direction when viewed overhead above the floor;

a second air blower including a plurality of second air outlets disposed along a side with respect to the row direction, facing the plurality of second heat generating device columns, the second air blower being configured to blow air in the second room in the column direction from the plurality of second air outlets, wherein a front and back of the plurality of rack servers in each of the second heat generating device columns are exposed within the second room;

a second inclined ceiling that increases in height from the second side toward the first side in the row direction; and a corridor disposed between the first room and the second room, wherein the first inclined ceiling and the second inclined ceiling are bilaterally symmetric with respect to the corridor in a side view from the column direction, and the corridor being defined by a space formed between the first side wall and the second side wall and between the floor and ceiling portion that coincides with a highest point of the first inclined ceiling and the second inclined ceiling, the plurality of first heat generating device columns and the plurality of second heat generating device columns are bilaterally symmetric with respect to the corridor in a planar view and are bilaterally symmetric with respect to the corridor in a side view from the column direction, and the plurality of first air outlets and the plurality of second air outlets are bilaterally symmetric with respect to the corridor in a side view from the column direction.

2. The data center according to claim 1, wherein a clearance, between each of the plurality of heat generating device columns and the inclined ceiling, increases from the first side toward the second side.

3. The data center according to claim 1, further comprising:

an exhaust port that is provided in the side wall on the second side in the row direction, the exhaust port being configured to exhaust air in the room outside of the room.

4. The data center according to claim 3, wherein a height of the exhaust port is greater than or equal to a height of the inclined ceiling on the first side.

5. The data center according to claim 3, wherein the exhaust port is positioned directly below the inclined ceiling on the second side.

6. The data center according to claim 1, wherein the plurality of first air outlets are disposed along both sides with respect to the row direction, and the plurality of first air outlets blow air from both sides with respect to the row direction.

7. The data center according to claim 6, wherein the plurality of first air outlets are alternately disposed in the row direction, on the first side and on the second side with respect to the row direction.

8. The data center according to claim 1, wherein a height of the plurality of first air outlets from the floor is less than or equal to half a height between the floor and the inclined ceiling.

9. The data center according to claim 1, wherein a height difference is provided between the plurality of first air outlets and the floor.

10. The data center according to claim 1, wherein the first room is a power supply zone and a number of the plurality of heat generating devices included in each of the plurality of heat generating device columns is larger on the second side than on the first side in the row direction.

11. The data center according to claim 1, wherein the first air blower includes an air blowing device configured to blow air to the plurality of first air outlets, and the air blowing device is disposed outside of the room with respect to the side wall.

12. The data center according to claim 1, wherein the first air blower blows cooling air having a predetermined temperature that is lower than room temperature.

13. The data center according to claim 1, further comprising:

a first exhaust port that is provided in the first side wall on the second side in the row direction, the first exhaust port being configured to exhaust air in the first room outside of the first room; and a second exhaust port that is provided in the second side wall on the first side in the row direction, the second exhaust port being configured to exhaust air in the second room outside of the second room.

* * * * *